(12) United States Patent
Kang et al.

(10) Patent No.: US 11,342,470 B2
(45) Date of Patent: May 24, 2022

(54) INCLINED THIN FILM SOLAR CELL

(71) Applicant: DAEGU GYEONGBUK INSTITUTE OF SCIENCE AND TECHNOLOGY, Daegu (KR)

(72) Inventors: Jin Kyu Kang, Daegu (KR); Dae-Hwan Kim, Daegu (KR); Kee Jeong Yang, Daegu (KR); Sam Mi Kim, Daegu (KR); Se Yun Kim, Daegu (KR); Kwang Seok Ahn, Daegu (KR)

(73) Assignee: DAEGU GYEONGBUK INSTITUTE OF SCIENCE AND TECHNOLOGY, Daegu (KR)

( * ) Notice: Subject to any disclaimer, the term of this patent is extended or adjusted under 35 U.S.C. 154(b) by 0 days.

(21) Appl. No.: 16/910,580

(22) Filed: Jun. 24, 2020

(65) Prior Publication Data
US 2021/0043786 A1 Feb. 11, 2021

(30) Foreign Application Priority Data
Aug. 8, 2019 (KR) .................. 10-2019-0096846

(51) Int. Cl.
*H01L 31/0236* (2006.01)
*H01L 31/18* (2006.01)
*H01L 31/02* (2006.01)
*H01L 31/0445* (2014.01)

(52) U.S. Cl.
CPC .... *H01L 31/02366* (2013.01); *H01L 31/0201* (2013.01); *H01L 31/02363* (2013.01); *H01L 31/0445* (2014.12); *H01L 31/18* (2013.01)

(58) Field of Classification Search
CPC ........... H01L 31/02363; H01L 31/0445; H01L 31/0201; H01L 31/02366
See application file for complete search history.

(56) References Cited

U.S. PATENT DOCUMENTS

| | | | | |
|---|---|---|---|---|
| 3,419,434 A | * | 12/1968 | Colehower | H01L 31/00 136/246 |
| 5,024,953 A | * | 6/1991 | Uematsu | H01L 21/3083 438/71 |
| 2008/0072958 A1 | * | 3/2008 | Dutta | H01L 31/03529 136/256 |
| 2015/0007868 A1 | * | 1/2015 | Chen | H01L 31/0547 136/246 |

FOREIGN PATENT DOCUMENTS

KR 1020120053127 5/2012

OTHER PUBLICATIONS

English-language translation of KR 1020120053127.

* cited by examiner

*Primary Examiner* — Lindsey A Bernier
(74) *Attorney, Agent, or Firm* — Harness, Dickey & Pierce, P.L.C.

(57) ABSTRACT

Disclosed herein is an inclined thin film solar cell. The inclined thin film solar cell includes a substrate including at least one first surface having a surface inclined at a first angle with respect to the bottom surface of the substrate and at least one second surface located adjacent to the first surface and having a surface which is connected to a next inclined surface and inclined at a second angle, a first electrode famed on a surface of the substrate, a light absorbing layer famed on the first electrode, and a second electrode formed on the light absorbing layer.

7 Claims, 5 Drawing Sheets

INCLINED THIN FILM SOLAR CELL

CROSS-REFERENCES TO RELATED APPLICATION

This patent application claims the benefit of priority under 35 U.S.C. § 119 from Korean Patent Application No. 10-2019-0096846 filed Aug. 8, 2019, the contents of which are incorporated herein by reference.

BACKGROUND OF THE INVENTION

1. Field of the Invention

The present disclosure relates to an inclined thin film solar cell.

2. Description of the Related Art

Due to concerns about the depletion of fossil fuels and the severity of environmental pollution in recent years, the development of clean energy to replace fossil fuels has been active. Clean energy includes solar power, tidal power, wind power, and the like, and among these, solar power generation devices with the least environmental impact and high technical completeness have been most actively developed and installed.

The amount of power generation of solar power generation devices depends on the duration of sunshine and the incident angle of a solar module. Therefore, in the existing art, an inclination angle control device, a solar tracking device, and the like are installed in a solar module to control the inclination angle and direction of the solar module according to the position change of the sun, thereby forming an optimal incident angle to maximize the amount of power generation.

However, typically, the installation angle of a module is controlled to maximize the power generation of a solar cell, which is a method difficult to be applied to a BIPV and the like. A BIPV (Building integrated photovoltaic) is installed in a building or an automobile, and has great difficulty in the control of the angle thereof. Although in some cases, a BIPV is installed to be inclined, the inclined BIPV has disadvantages in that the installation cost is large and the appearance is not aesthetically good while being inconsistent to the original purpose of the BIPV. Therefore, a solar cell is installed without being inclined, in which case, the amount of power generation amount falls below 60%.

In the case of a silicon solar cell, a method for forming a solar cell to be inclined by using a module support when manufacturing a module is proposed. However, the method is not significantly different from a method of controlling the installation angle of a module, and has a limitation of not being applicable to a thin film solar cell in which a cell and a module are simultaneously produced.

PRIOR ART DOCUMENT

Patent Document (Patent Document 1) Korean Patent Laid-Open Publication No. 10-2012-0053127 A

SUMMARY OF THE INVENTION

Embodiments of the present invention are directed to provide a thin film solar cell which may be effectively applied to buildings, automobiles, and the like where a solar cell cannot be installed at an optimal angle of sunlight, and thus, may improve the amount of solar cell power generation.

According to an aspect of the present invention, there is provided an inclined thin film solar cell including a substrate including at least one first surface having a surface inclined at a first angle with respect to the bottom surface of the substrate and at least one second surface located adjacent to the first surface and having a surface which is connected to a next inclined surface and inclined at a second angle, a first electrode famed on a surface of the substrate, a light absorbing layer famed on the first electrode, and a second electrode formed on the light absorbing layer.

According to another aspect of the present invention, there is provided a method for manufacturing an inclined thin film solar cell, the method including preparing a substrate including at least one first surface having a surface inclined at a first angle with respect to the bottom surface of the substrate and at least one second surface located adjacent to the first surface and having a surface which is connected to a next inclined surface and inclined at a second angle, forming a first electrode on a surface of the substrate, forming a light absorbing layer on the first electrode, and forming a second electrode on the light absorbing layer.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Features and advantages of the present invention will be more clearly understood by the following detailed description of the present preferred embodiments by reference to the accompanying drawings. It is first noted that terms or words used herein should be construed as meanings or concepts corresponding with the technical sprit of the present invention, based on the principle that the inventor can appropriately define the concepts of the terms to best describe his own invention. Also, it should be understood that detailed descriptions of well-known functions and structures related to the present invention will be omitted so as not to unnecessarily obscure the important point of the present invention.

Hereinafter, specific embodiments of the present invention will be described in detail with reference to the accompanying drawings.

According to an aspect of the present invention, there is provided an inclined thin film solar cell including a substrate including at least one first surface having a surface inclined at a first angle with respect to the bottom surface of the substrate and at least one second surface located adjacent to the first surface and having a surface which is connected to a next inclined surface and inclined at a second angle, a first electrode famed on a surface of the substrate, a light absorbing layer famed on the first electrode, and a second electrode famed on the light absorbing layer.

At this time, FIG. 1 to FIG. 4 are schematic views of examples of inclined thin film solar cells and an inclined substrate provided in one aspect of the present invention, and hereinafter, referring to the schematic views of FIG. 1 to FIG. 4, an inclined thin film solar cell provided in one aspect of the present invention will be described in detail.

Figure 1:
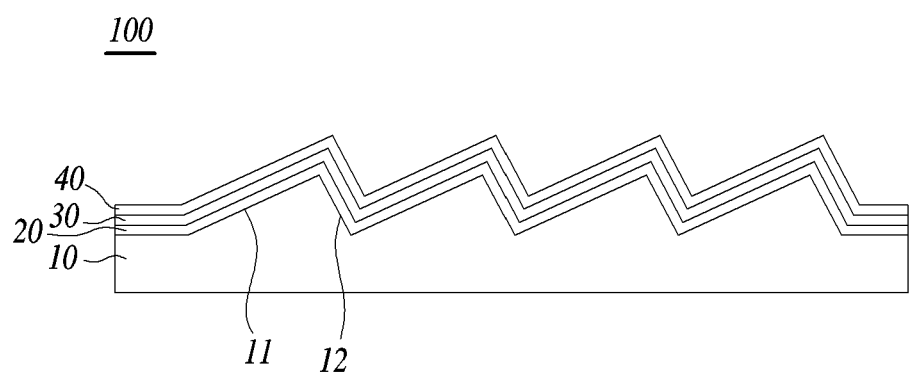
FIG. 1 is a schematic view of an inclined thin film solar cell according to an embodiment of the present invention.
Figure 2:
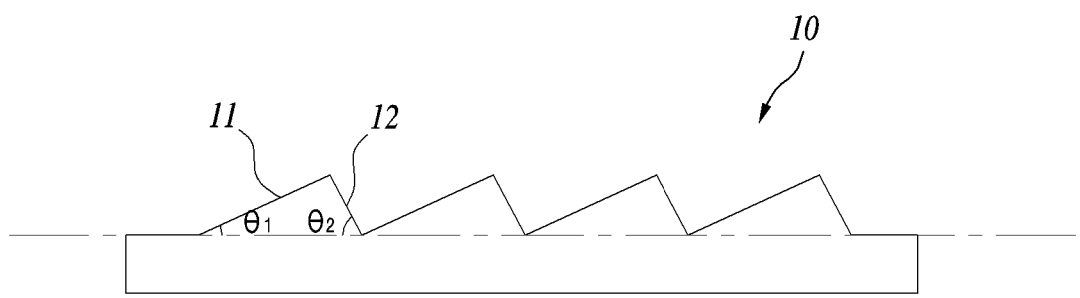
FIG. 2 is a schematic view of a substrate applied to an inclined thin film solar cell according to an embodiment of the present invention.
Figure 3:
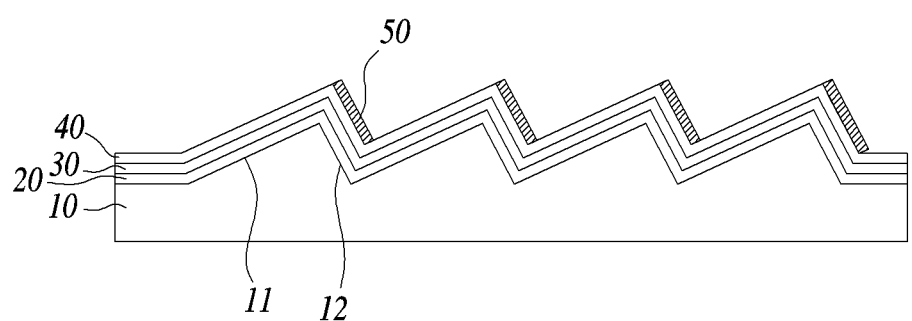
FIG. 3 is a schematic view of an inclined thin film solar cell according to another embodiment of the present invention.
Figure 4:
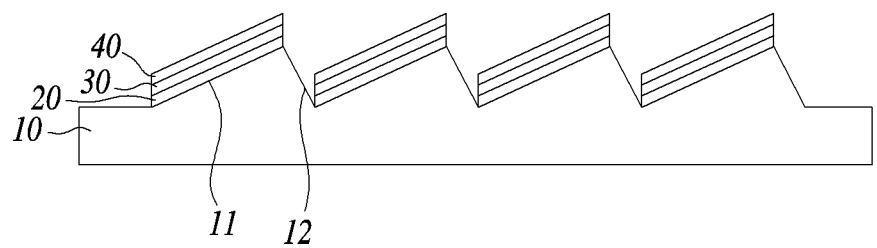
FIG. 4 is a schematic view of an inclined thin film solar cell according to yet another embodiment of the present invention.

FIG. 1, FIG. 3, and FIG. 4 are cross-sectional views schematically illustrating an inclined thin film solar cell according to an embodiment of the present invention, and FIG. 2 is a cross-sectional view schematically illustrating a substrate having an inclined surface structure applied to the inclined thin film solar cell according to an embodiment of the present invention.

Referring to FIG. 1 and FIG. 2, an inclined thin film solar cell 100 provided in one aspect of the present invention includes a substrate 10 including at least one first surface 11 having a surface inclined at a first angle $\theta_1$ with respect to the bottom surface of the substrate 10 and at least one second surface 12 located adjacent to the first surface 11 and having a surface which is connected to a next inclined surface and inclined at a second angle $\theta_2$.

In the present invention, in order to maximize the amount of solar cell power generation, instead of configuring a module to be inclined, a solar cell itself is formed to be inclined. The substrate 10 has a surface inclined at a specific angle with respect to the bottom surface of the substrate 10.

The first surface 11 has a surface inclined at the first angle $\theta_1$ with respect to the bottom surface of the substrate 10, and the first surface 11 is a surface on which sunlight is irradiated in a building or an automobile in which a thin film solar cell is installed. It is preferable that thin film solar cell element components are stacked on an upper portion of the first surface 11.

The second surface 12 has a surface inclined at the second angle $\theta_2$ with respect to the bottom surface of the substrate 10, and is formed to be in contact with the first surface 11 which is adjacent thereto.

At this time, the first angle $\theta_1$ may be 10° to 80°, 15° to 75°, 20° to 70°, 25° to 65°, 30° to 60°, 35° to 55°, 40° to 50°, 42° to 48°, or about 45°.

In addition, the second angle $\theta_2$ may be 20° to 90°, 25° to 85°, 30° to 80°, 35° to 75°, 40° to 70°, 45° to 65°, or 50° to 60°.

Furthermore, the substrate 10 may be a glass substrate which has excellent light transmittance, a polymer substrate, or the like. For example, the glass substrate may use soda lime glass or high strained point soda glass, and the polymer substrate may use a flexible polymer material such as, but not limited to, polyimide. The glass substrate may be formed of low iron tempered glass containing less iron to protect internal elements from external impact and the like, and to increase the transmittance of sunlight.

When the substrate 10 is made of glass, by forming an inclined surface structure as described above at the time of manufacturing the glass, the technical cost and the like spent to form a typical module to be inclined may be significantly reduced.

The inclined thin film solar cell 100 provided in one aspect of the present invention includes a first electrode 20, and the first electrode 20 is formed on a surface of the substrate 10.

The first electrode 20 may be formed on the first surface 11 of the substrate 10, the second surface 12, or the first surface 11 and the second surface 12. The first electrode 20 may have a surface inclined at the first angle $\theta_1$ with respect to the bottom surface of the substrate 10, and may have a surface inclined at the second angle $\theta_2$. For a specific example, the first electrode 20 is formed on the entire surface of the substrate 10, and may be formed on the first surface 11 and the second surface 12, or may be formed only on the first surface 11.

The first electrode 20 may be a rear electrode, and the first electrode 20 may be made of a metal material having excellent conductivity and light transmittance, such as molybdenum (Mo), aluminum (Al), or copper (Cu), such that charges formed by a photoelectric effect are collected and light transmitted through a light absorbing layer is reflected to be re-absorbed by the light absorbing layer. Particularly, the first electrode 20 may be formed by including molybdenum (Mo) in consideration of high conductivity, ohmic contact with the light absorbing layer, high temperature stability, and the like. The first electrode 20 may be formed as a single film of a metal material, or formed as multiple films to ensure the bonding to the substrate 10 and the resistance properties of the first electrode 20 itself.

The inclined thin film solar cell 100 provided in one aspect of the present invention includes a light absorbing layer 30, and the light absorbing layer 30 is formed on the first electrode 20.

The light absorbing layer 30 may be formed on a surface of the first electrode 20 which is formed on the first surface 11 of the substrate 10, on a surface of a second electrode which is formed on the second surface 12, or formed on a surface of the first electrode 20 which is formed on the first surface 11 and on a surface of the second electrode which is formed on the second surface 12. The light absorbing layer 30 may have a surface inclined at the first angle $\theta_1$ with respect to the bottom surface of the substrate 10, and may have a surface inclined at the second angle $\theta_2$. For a specific example, the light absorbing layer 30 is famed on the entire surface of the first electrode 20, and may be formed on the first electrode 20 which is formed on the first surface 11 and on the first electrode 20 which is famed on the second surface 12, or may be formed only on the first surface 11.

The light absorbing layer 30 may be formed of a copper-indium-gallium-sulfide including copper (Cu), indium (In), gallium (Ga), and sulfur (S) and/or selenium (Se), or formed of a selenide (CIGS, CIGSe or CIGSSe)-based compound to form a P-type semiconductor layer, and may absorb incident sunlight. Alternatively, the light absorbing layer 30 may be formed of a copper-zinc-tin-sulfide including copper (Cu), zinc (Zn), tin (Sn), and sulfur (S) and/or selenium (Se), or formed of a selenide (CZTS, CZTSe or CZTSSe)-based compound to form a P-type semiconductor layer.

The inclined thin film solar cell 100 provided in one aspect of the present invention includes a second electrode 40, and the second electrode 20 is formed on the light absorbing layer 30.

The second electrode 40 may be formed on an upper portion of the first surface 11 of the substrate 10, on an upper portion of the second surface 12, or on upper portions of the first surface 11 and the second surface 12. The second electrode 20 may have a surface inclined at the first angle $\theta_1$ with respect to the bottom surface of the substrate 10, and may have a surface inclined at the second angle $\theta_2$. For a specific example, the second electrode 40 is formed on the entire surface of the light absorbing layer 30, and may be formed on the light absorbing layer 30 which is formed on an upper portion of the first surface 11 and on the light absorbing layer 30 which is formed on an upper portion of the second surface 12, or may be formed only on the upper portion of the first surface 11.

The second electrode 40 forms a P-N junction with the light absorbing layer 30 and captures the charges formed by the photoelectric effect. The second electrode 40 may include a transparent conductive material such as ZnO: B, ITO or IZO. The upper surface of the second electrode 40 may be textured to reduce the reflection of incident sunlight and increase light absorption into the light absorbing layer 30.

The inclined thin film solar cell 100 may include, for a specific example, as shown in the schematic view of FIG. 3, the substrate 10 including at least one first surface 11 having a surface inclined at the first angle $\theta_1$ with respect to the bottom surface of the substrate 10 and at least one second surface 12 located adjacent to the first surface 11 and having a surface inclined at the second angle $\theta_2$ which is connected to the next inclined surface, the first electrode 20 famed on a surface of the substrate 10, the light absorbing layer 30 formed on the first electrode 20, the second electrode 40 formed on the light absorbing layer 30, and a bus bar 50 formed on the second electrode 40, wherein the bus bar is formed only on an upper portion on the side of the second surface 12 and has a surface inclined at the second angle $\theta_2$ with respect to the bottom surface of the substrate 10.

Since the bus bar 50 is famed only on an upper portion in a direction perpendicular to the surface of the second surface 12 of the substrate 10, the amount of power generation per unit area of a solar cell module may be maximized. In a typical silicon solar cell module, each solar cell unit cell is connected using a metal ribbon or the like, but the inclined thin film solar cell 100 of the present invention is configured in a monolithic connection method to form a bus bar serving to collect charges on the second surface 12 of an inclined structure. Therefore, it is possible to maximize the amount of power generation per unit area of a solar cell module.

The inclined thin film solar cell 100 may include, for a specific example, as shown in the schematic view of FIG. 4, the substrate 10 including at least one first surface 11 having a surface inclined at the first angle $\theta_1$ with respect to the bottom surface of the substrate 10 and at least one second surface 12 located adjacent to the first surface 11 and having a surface inclined at the second angle $\theta_2$ which is connected to the next inclined surface, the first electrode 20 formed on the first surface 11 of the substrate 10, the light absorbing layer 30 formed on the first electrode 20, and a second electrode 40 formed on the light absorbing layer 30.

The inclined thin film solar cell 100 may include the first electrode 20, the light absorbing layer 30, and the second electrode 40 stacked only on an upper portion in a direction perpendicular to the surface of the first surface 11 of the substrate 10.

Figure 5:
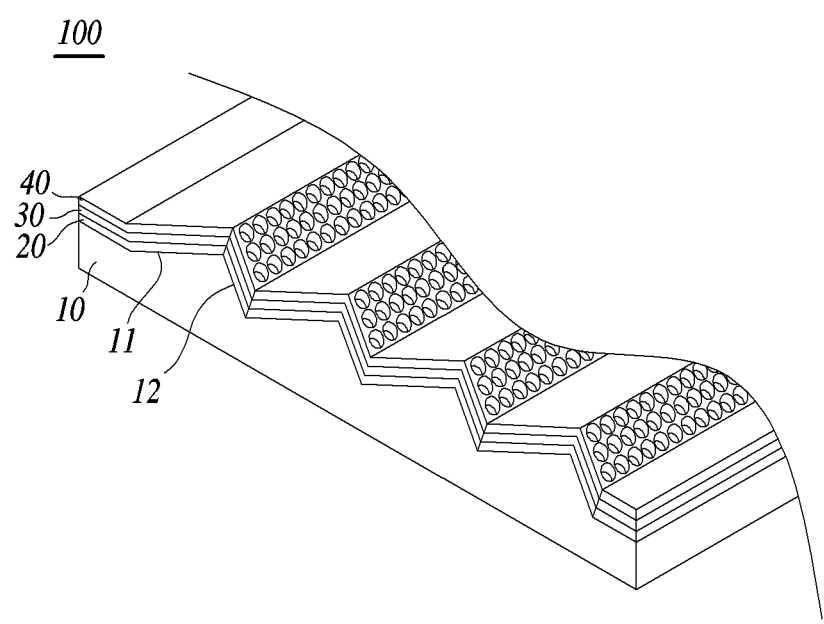
FIG. 5 is a schematic view of an inclined thin film solar cell according to yet another embodiment of the present invention.

Also, the inclined thin film solar cell 100 may have a hole formed on at least a portion of a solar cell configuration layer including the first electrode 20, the light absorbing layer 30, and the second electrode 40 formed on an upper portion of the second surface 12. For a specific example, as shown in the schematic view of FIG. 5, a solar cell configuration layer (the first electrode 20, the light absorbing layer 30, and the second electrode 40) stacked on the second surface 12 may be etched in a predetermined pattern form to form a hole.

The inclined thin film solar cell 100 may be applied as a transparent solar cell by forming the hole on the second surface 12.

The thin film solar cell 100 may further include a buffer layer (not shown) formed on the light absorbing layer 30. The buffer layer reduces a band gap difference between the light absorbing layer 30 and the second electrode 40 and reduces recombination of electrons and holes which may occur between the light absorbing layer 30 and the second electrode interface. The buffer layer may be formed of CdS, ZnS, $In_2S_3$, $Zn_xMg_{(1-x)}O$, or the like.

According to another aspect of the present invention, there is provided a method for manufacturing an inclined thin film solar cell, the method including preparing a substrate including at least one first surface having a surface inclined at a first angle with respect to the bottom surface of the substrate and at least one second surface located adjacent to the first surface and having a surface inclined at a second angle which is connected to the next inclined surface, forming a first electrode on a surface of the substrate, forming a light absorbing layer on the first electrode, and forming a second electrode on the light absorbing layer.

Hereinafter, each step of the method for manufacturing an inclined thin film solar cell, the method provided in another aspect of the present invention will be described in detail.

First, the method for manufacturing an inclined thin film solar cell, the method provided in another aspect of the present invention includes preparing a substrate including at least one first surface having a surface inclined at a first angle with respect to the bottom surface of the substrate and at least one second surface located adjacent to the first surface and having a surface inclined at a second angle which is connected to the next inclined surface.

In the present invention, in order to maximize the amount of solar cell power generation, instead of configuring a module to be inclined, a solar cell itself is formed to be inclined. A substrate having a surface inclined at a specific angle with respect to the bottom surface of the substrate is prepared.

The first surface has a surface inclined at the first $\theta_1$ with respect to the bottom surface of the substrate, and the first surface is a surface on which sunlight is irradiated in a building or an automobile in which a thin film solar cell is installed. It is preferable that thin film solar cell element components are stacked on an upper portion of the first surface.

The second surface has a surface inclined at the second $\theta_2$ with respect to the bottom surface of the substrate, and is formed to be in contact with the first surface which is adjacent thereto.

The substrate may be a glass substrate which has excellent light transmittance, a polymer substrate, or the like. For example, the glass substrate may use soda lime glass or high strained point soda glass, and the polymer substrate may use a flexible polymer material such as, but not limited to, polyimide. The glass substrate may be formed of low iron tempered glass containing less iron to protect internal elements from external impact and the like, and to increase the transmittance of sunlight. When the substrate is made of glass, by forming an inclined surface structure as described above at the time of manufacturing the glass, the technical cost and the like spent to form a typical module to be inclined may be significantly reduced.

Next, the method for manufacturing an inclined thin film solar cell, the method provided in another aspect of the present invention includes forming a first electrode on a surface of the substrate.

In the above step, the first electrode is formed on the surface of the substrate, that is, on all surfaces including the first surface, the second surface, or the first surface and the second surface of the substrate.

The first electrode may be a rear electrode, and the first electrode may be made of a metal material having excellent conductivity and light transmittance, such as molybdenum (Mo), aluminum (Al), or copper (Cu), such that charges formed by a photoelectric effect are collected and light transmitted through a light absorbing layer is reflected to be re-absorbed by the light absorbing layer. Particularly, the first electrode may be formed by including molybdenum (Mo) in consideration of high conductivity, ohmic contact with the light absorbing layer, high temperature stability, and the like. The first electrode may be formed as a single film of a metal material, or formed as multiple films to ensure the bonding to the substrate and the resistance properties of the first electrode itself.

The rear electrode may have a thickness of 0.2 μm to 5 μm, and may be formed by a sputtering process.

Next, the method for manufacturing an inclined thin film solar cell, the method provided in another aspect of the present invention includes forming a light absorbing layer on the first electrode.

In the above step, the light absorbing layer is formed on an upper portion in a direction perpendicular to the surface of the first surface.

The light absorbing layer may be formed of a copper-indium-gallium-sulfide including copper (Cu), indium (In), gallium (Ga), and sulfur (S) and/or selenium (Se), or formed of a selenide (CIGS, CIGSe or CIGSSe) -based compound to form a P-type semiconductor layer, and may absorb incident sunlight. Alternatively, the light absorbing layer may be formed of a copper-zinc-tin-sulfide including copper (Cu), zinc (Zn), tin (Sn), and sulfur (S) and/or selenium (Se), or formed of a selenide (CZTS, CZTSe or CZTSSe)-based compound to form a P-type semiconductor layer.

The light absorbing layer may be formed by forming a precursor layer of each metal through any one method of a sputtering method and a simultaneous evaporation deposition method, and performing one or more processes of a sulfidation process, a selenization process, and a sulfide-selenization process.

The thickness of the light absorbing layer may be 0.5 μm to 3 μm.

Next, the method for manufacturing an inclined thin film solar cell, the method provided in another aspect of the present invention includes forming a second electrode on the light absorbing layer.

In the above step, the second electrode is formed on an upper portion in a direction perpendicular to the surface of the light absorbing layer.

Before forming the second electrode, a step of forming a buffer layer on a surface of the light absorbing layer may be performed. The buffer layer reduces a band gap difference between the light absorbing layer and the second electrode and reduces recombination of electrons and holes which may occur between the light absorbing layer and the second electrode interface. The buffer layer may be formed of CdS, ZnS, $In_2S_3$, $Zn_xMg_{(1-x)}O$, or the like.

The buffer layer may be formed by a vacuum process, a thermal deposition process, a chemical solution growth method, or the like, and the thickness of the buffer layer may be 10 nm to 200 nm.

The second electrode forms a P-N junction with the light absorbing layer and captures the charges formed by the photoelectric effect. The second electrode 40 may include a transparent conductive material such as ZnO: B, ITO or IZO. The upper surface of the second electrode 40 may be textured to reduce the reflection of incident sunlight and increase light absorption into the light absorbing layer 30.

The second electrode may be formed by a sputtering method, a thermal deposition process, or the like, and the thickness of the second electrode may be 100 nm and 1000 nm.

In addition, the inclined thin film solar cell may form a bus bar such that the bus bar is included only on an upper portion on the side of the second surface of the substrate, though which the amount of solar cell power generation may be maximized.

Furthermore, a method for manufacturing an inclined thin film solar cell, the method provided in another aspect of the present invention may improve the transparency of a thin film solar cell by stacking a first electrode, a light absorbing layer, and a second electrode which constitute a solar cell element, and then removing the first electrode, the light absorbing layer, and the second electrode which are famed on a second surface of a substrate, thereby improving the transparency of the thin film solar cell.

In addition, a method for manufacturing an inclined thin film solar cell, the method provided in yet another aspect of the present invention may improve the transparency of a thin film solar cell by stacking a first electrode, a light absorbing layer, and a second electrode which constitute a solar cell element, and then etching the first electrode, the light absorbing layer, and the second electrode which are formed on a second surface of a substrate to form a hole.

An inclined thin film solar cell provided in one aspect of the present invention may be installed in a place, such as a building or an automobile, where it is difficult to install a solar cell module to be inclined, and thus, may exhibit an excellent amount of solar cell power generation. In addition, only a thin film solar cell element which is formed to be inclined so as to be suitable for solar power generation is located on some surfaces of a substrate, whereas a bus bar electrode is formed on other surfaces of the substrate, so that the amount of power generation per unit area may be maximized.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An inclined thin film solar cell comprising:
   a substrate including at least one first surface inclined at a first angle with respect to a bottom surface of the substrate and at least one second surface directly adjacent to the at least one first surface, wherein the at least one second surface is directly connected to a next inclined surface and inclined at a second angle with respect to the bottom surface of the substrate;
   a first electrode only on the at least one first surface of the substrate;
   a light absorbing layer on the first electrode;
   a second electrode on the light absorbing layer; and
   a bus bar on the second electrode,
   wherein the bus bar is located only on an upper portion of the at least one second surface and has a surface inclined at the second angle with respect to the bottom surface of the substrate, and
   wherein the substrate is a glass substrate having light transmittance.

2. The inclined thin film solar cell of claim 1, wherein the first electrode, the light absorbing layer, and the second electrode have a surface inclined at the first angle with respect to the bottom surface of the substrate.

3. The inclined thin film solar cell of claim 1, wherein the first electrode, the light absorbing layer, and the second electrode are stacked on the at least one first surface of the substrate.

4. The inclined thin film solar cell of claim 1, wherein the first angle is 10° to 80°.

5. The inclined thin film solar cell of claim 1, wherein the second angle is 20° to 90°.

6. The inclined thin film solar cell of claim 1, further comprising:
   a buffer layer on the light absorbing layer.

7. A method for manufacturing an inclined thin film solar cell, the method comprising:
   preparing a substrate including at least one first surface inclined at a first angle with respect to a bottom surface of the substrate and at least one second surface directly adjacent to the at least one first surface, wherein the at least one second surface is directly connected to a next inclined surface and inclined at a second angle with respect to the bottom surface of the substrate;
   forming a first electrode only on the at least one first surface of the substrate;
   forming a light absorbing layer on the first electrode;
   forming a second electrode on the light absorbing layer; and
   forming a bus bar on the second electrode,
   wherein the bus bar is formed only on an upper portion of the at least one second surface and has a surface inclined at the second angle with respect to the bottom surface of the substrate, and
   wherein the substrate is a glass substrate having light transmittance.

\* \* \* \* \*